(12) United States Patent
Hurkx et al.

(10) Patent No.: US 8,114,774 B2
(45) Date of Patent: Feb. 14, 2012

(54) SEMICONDUCTOR DEVICE, AND SEMICONDUCTOR DEVICE OBTAINED BY SUCH A METHOD

(75) Inventors: Godefridus Adrianus Maria Hurkx, Best (NL); Johannes Josephus Theodorus Marinus Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 531 days.

(21) Appl. No.: 12/304,332

(22) PCT Filed: Jun. 6, 2007

(86) PCT No.: PCT/IB2007/052319
§ 371 (c)(1),
(2), (4) Date: Dec. 11, 2008

(87) PCT Pub. No.: WO2007/148277
PCT Pub. Date: Dec. 27, 2007

(65) Prior Publication Data
US 2009/0203214 A1 Aug. 13, 2009

(30) Foreign Application Priority Data
Jun. 19, 2006 (EP) ..................................... 06115650

(51) Int. Cl.
*H01L 21/302* (2006.01)
(52) U.S. Cl. ............... 438/692; 438/8; 438/691; 216/89
(58) Field of Classification Search .................. 438/691, 438/692, 693, 8, 694, 738; 216/88, 89
See application file for complete search history.

(56) References Cited

U.S. PATENT DOCUMENTS

| 6,672,941 B1 | 1/2004 | Yu et al. | |
| 7,145,541 B2 * | 12/2006 | Kurokawa et al. | 345/98 |
| 2002/0055192 A1 * | 5/2002 | Redeker et al. | 438/8 |
| 2003/0100189 A1 | 5/2003 | Lee et al. | |
| 2003/0189202 A1 | 10/2003 | Li et al. | |
| 2004/0005769 A1 | 1/2004 | Makolas | |
| 2004/0124492 A1 * | 7/2004 | Matsuo | 257/506 |
| 2004/0263868 A1 | 12/2004 | Isei | |
| 2005/0084990 A1 | 4/2005 | Liu et al. | |
| 2005/0130341 A1 | 6/2005 | Furukawa et al. | |
| 2005/0145932 A1 | 7/2005 | Park et al. | |
| 2006/0091450 A1 * | 5/2006 | Zhu et al. | 257/316 |
| 2007/0232015 A1 * | 10/2007 | Liu | 438/396 |

FOREIGN PATENT DOCUMENTS

| EP | 1026832 A1 | 9/2000 |
| EP | 1068928 A2 | 1/2001 |
| WO | 2005050730 A | 6/2005 |
| WO | 2005076381 A | 8/2005 |
| WO | 2005117131 A | 12/2005 |

* cited by examiner

*Primary Examiner* — Lan Vinh

(57) ABSTRACT

The invention relates to a method of manufacturing a semiconductor device with a substrate and a semiconductor body, whereby in the semiconductor body a semiconductor element is formed by means of a mesa-shaped protrusion of the semiconductor body, which is formed on the surface of the semiconductor device as a nano wire, whereupon a layer of a material is deposited over the semiconductor body and the resulting structure is subsequently planarized in a chemical-mechanical polishing process such that an upper side of the nano wire becomes exposed. According to the invention, a further layer of a further material is deposited over the semiconductor body with the nano wire before the layer of the material is deposited, which further layer is given a thickness smaller than the height of the nano wire, and a material is chosen for the further material such that, viewed in projection, the transition between the layer and the further layer is discernible before the nano wire is reached. In this way the nano wire can be exposed more accurately in the device. This increases the yield of useful devices.

16 Claims, 4 Drawing Sheets

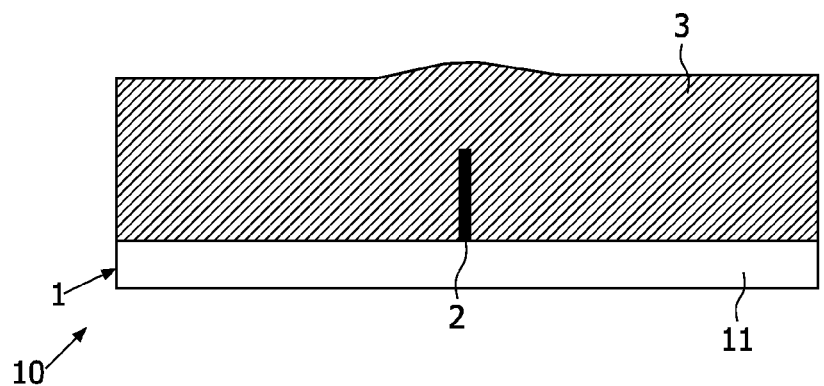
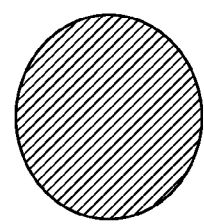
FIG. 1a  FIG. 1b
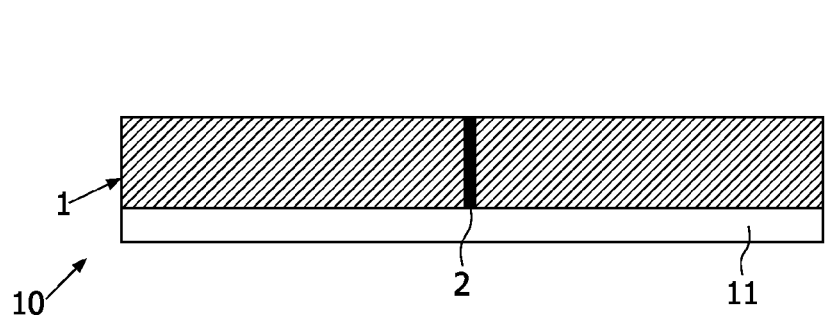
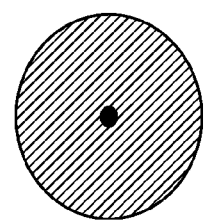
FIG. 2a  FIG. 2b

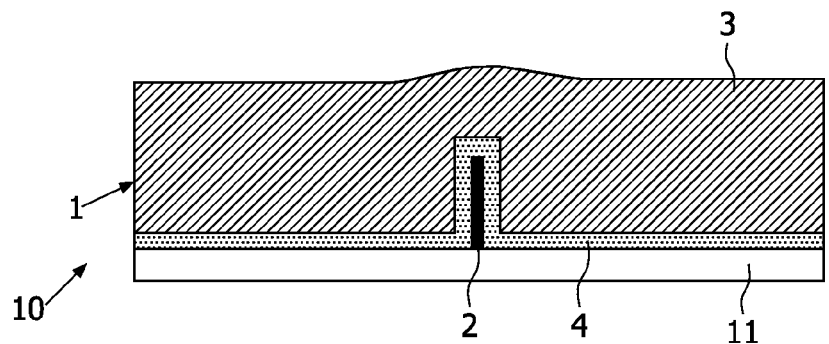 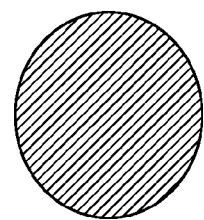
FIG. 3a    FIG. 3b
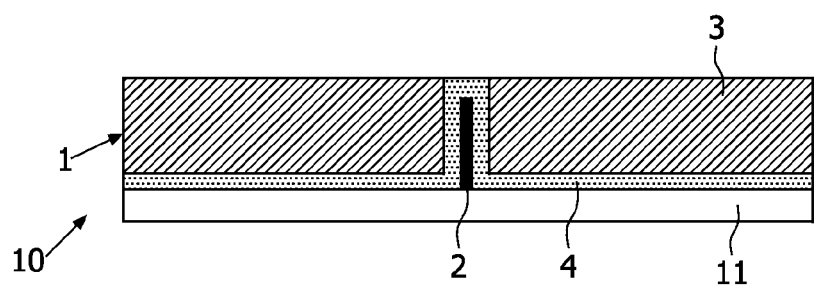 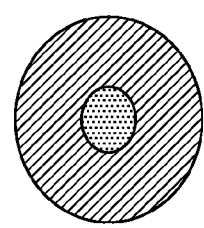
FIG. 4a    FIG. 4b
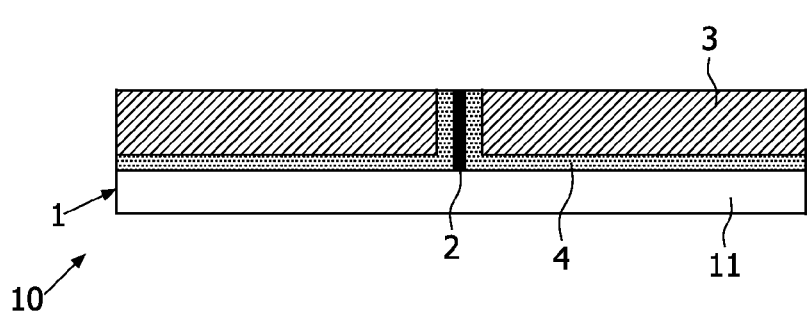 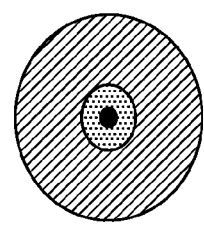
FIG. 5a    FIG. 5b

SEMICONDUCTOR DEVICE, AND SEMICONDUCTOR DEVICE OBTAINED BY SUCH A METHOD

FIELD OF THE INVENTION

The invention relates to a method of manufacturing a semiconductor device with a substrate and a semiconductor body, whereby a semiconductor element is formed in the semiconductor body by means of a mesa-shaped protrusion of the semiconductor body, which protrusion is provided in the form of a nano wire on the surface of the semiconductor body, whereupon a layer of a material is deposited over the semiconductor body with the nano wire and the resulting structure is subsequently planarized in a CMP (=Chemical-Mechanical Polishing) process by means of which an upper side of the nano wire is exposed. A "nano wire" in the present application is understood to be a body of which at least a lateral dimension lies between 0.5 and 100 nm, and more in particular between 1 and 50 nm. Preferably, the nano wire has dimensions that lie within said domain in two lateral directions. Such lateral dimensions cannot, or at least not easily, be realized by means of photolithography, while such dimensions are desired inter alia in view of the continually progressing miniaturization in IC (=Integrated Circuit) technology. Besides the component density, factors such as speed, breakdown voltage, and current and/or power consumption of the semiconductor elements, such as diodes or transistors, play a major part.

BACKGROUND OF THE INVENTION

Such a method is known from the patent application US 2003/0189202 published Oct. 9, 2003. It is described therein how electrodes are formed, for example on a silicon substrate, in that catalytic locations are created for growing nano wires. Nano wires are then formed thereon by means of a deposition technique, which wires may comprise a semiconductor material or may be, for example, carbon nano tubes. An electrically insulating layer thicker than the height of the nano wires is subsequently deposited over the entire assembly. The resulting structure is then planarized by a technique such as chemical-mechanical polishing, whereby an upper side of the nano wires is exposed. A metal may be deposited thereon, for example, so as to contact the nano wire. The device may comprise a chemical or biological sensor, or alternatively a field emitter for a picture display device or for other applications.

A disadvantage of the known method is that it is not easy to expose an upper side of the nano wire in an accurate manner. This is a drawback in particular if the nano wire forms part of a semiconductor element having a more complicated structure, such as a transistor.

OBJECT AND SUMMARY OF THE INVENTION

It is accordingly an object of the present invention to provide a method which does not have the disadvantage mentioned above and which renders it possible to expose the upper side of the nano wire in an accurate manner during chemical-mechanical polishing.

According to the invention, a method of the kind mentioned in the opening paragraph is for this purpose characterized in that a further layer of a further material is deposited over the semiconductor body with the nano wire before said layer of said material is deposited, which further layer is given a thickness smaller than the height of the nano wire, a material being chosen as the further material such that the transition between the layer and the further layer, seen in projection, is discernible before the nano wire is reached. The invention is based first of all on the recognition that an exact determination of the moment at which the upper side of the nano wire becomes exposed is not very well possible because the nano wire is not clearly visible. This is caused by the fact that the lateral dimensions of a nano wire are particularly small, and on the other hand that the material of the layer is sometimes somewhat opaque. The provision of a further layer achieves in the first place that this layer is reached first, before the nano wire is reached, during chemical-mechanical polishing. In addition, the provision of a further layer with a thickness smaller than the height of the nano wire as it were increases the lateral dimensions of the nano wire by twice the thickness of the deposited further layer. This renders it easier to make the nano wire visible/discernible when viewed in projection. The difference in refractive index between the layer and the further layer contributes to a better visibility of the transition between the further layer and the layer (which is deposited after the further layer). The nano wire itself can subsequently be exposed more accurately thanks to the improved visibility of the nano wire being reached while covered by the further layer, the latter having only a limited thickness.

In a preferred embodiment of a method according to the invention, the further layer is given a thickness of at least approximately 50 nm. In that case all nano wires provided with the further layer can be exposed approximately simultaneously, because this thickness corresponds to the inaccuracy of a CMP process over a substrate with a thickness— usual at the moment—of 8 inches.

If the lateral dimensions of the nano wire are particularly small, and if an optical detection of a nano wire covered by the further layer is desired, a thickness of at least 150 nm of the further layer is practically useful. This is because the lateral dimensions in such a case are at least 300 nm then, which corresponds to half a wavelength for a wavelength of 0.6 micron.

The visibility/delectability of the transition between the layer and the further layer, viewed in projection, may be created, for example, in that materials are chosen for these layers whose refractive indices differ sufficiently from one another. Thus the layer may be manufactured from silicon dioxide and the further layer from silicon nitride. The reverse situation is also feasible. The transition can be detected by means of electromagnetic radiation, which need not necessarily lie in the visible part of the spectrum. The detection advantageously utilizes an optical system, which term embraces lenses and other optical aids such as an imaging device, for example a camera.

In a favorable embodiment, the material of the further layer is strongly reflecting. This facilitates the detection of said transition. It is advantageous to use, for example, a further layer that comprises polycrystalline silicon for this purpose. Such a layer is not only comparatively strongly reflecting, but also highly compatible with silicon technology. A metal layer may alternatively be advantageously used as the strongly reflecting layer.

A particular advantage of a reflecting layer is that a layer suitable for this purpose often also has a good electrical conductance. This renders it possible to give the further layer a function in the formation of the semiconductor element. This may be, for example, a contacting function if said further layer is in direct contact with the nano wire.

Favorable modifications comprise situations in which the further layer is indeed conducting, but does not make contact with the nano wire, for example so as to act as a gate electrode for an element of which the nano wire forms part. In that case the further layer is preferably separated from the nano wire through the formation of an electrically insulating layer around the nano wire before the further layer is deposited.

This is possible, for example, by means of thermal oxidation of the nano wire. An advantage thereof is at the same time the lateral dimensions of the semiconductor part of the nano wire can be made small.

In a favorable modification, therefore, a different layer of a different material is deposited over the semiconductor body with the nano wire, and an electrically insulating material is chosen as this different material. In this manner the further layer can comprise a conducting layer without having any electrical contact with the nano wire. The thickness of said different layer may be chosen such that the further layer, constructed as a conducting layer, can have an electrical function such as that of a gate electrode. The different layer need not play a part in the step of accurately exposing the upper side of the nano wire, but it may do so.

The nano wire may be exposed with respect to the further layer and/or the different layer by means of chemical-mechanical polishing. This may alternatively be achieved, however, by means of a—preferably selective—etching step. The latter is true in particular for the different layer, because this is preferably very thin in those cases in which the further layer is electrically conducting and as such performs a function in the nano wire.

The nano wire is preferably used for forming a semiconductor element such as a transistor. The nano wire may advantageously form the gate electrode or the channel region of a (vertical) MOS (=Metal Oxide Semiconductor) transistor, or the emitter or collector of a bipolar transistor. The semiconductor material chosen for the semiconductor body is preferably silicon, or a mixed crystal thereof with a metal such as germanium.

A pattern recognition technique is advantageously used in recognizing that the transition between the layer and the further layer has been reached. In this case the optical system and optical aids used are connected to a computer which is provided with a computer program suitable for this purpose.

Finally, the invention also relates to a semiconductor device obtained by a method according to the invention.

BRIEF DESCRIPTION OF THE DRAWINGS

The invention will now be explained in more detail with reference to a few embodiments and the drawing, in which:

FIGS. 1 and 2 diagrammatically show a semiconductor device in consecutive stages of its manufacture by a known method (a) in a cross-section taken perpendicularly to the thickness direction and (b) in plan view, FIGS. 3 to 5 diagrammatically show a first semiconductor device in consecutive stages of its manufacture by a first embodiment of a method according to the invention (a) in a cross-section taken perpendicularly to the thickness direction and (b) in plan view, and FIGS. 6 to 8 diagrammatically show a second semiconductor device in consecutive stages of its manufacture by a second embodiment of a method according to the invention in a cross-section taken perpendicularly to the thickness direction.

DESCRIPTION OF EMBODIMENTS

Figure 6:
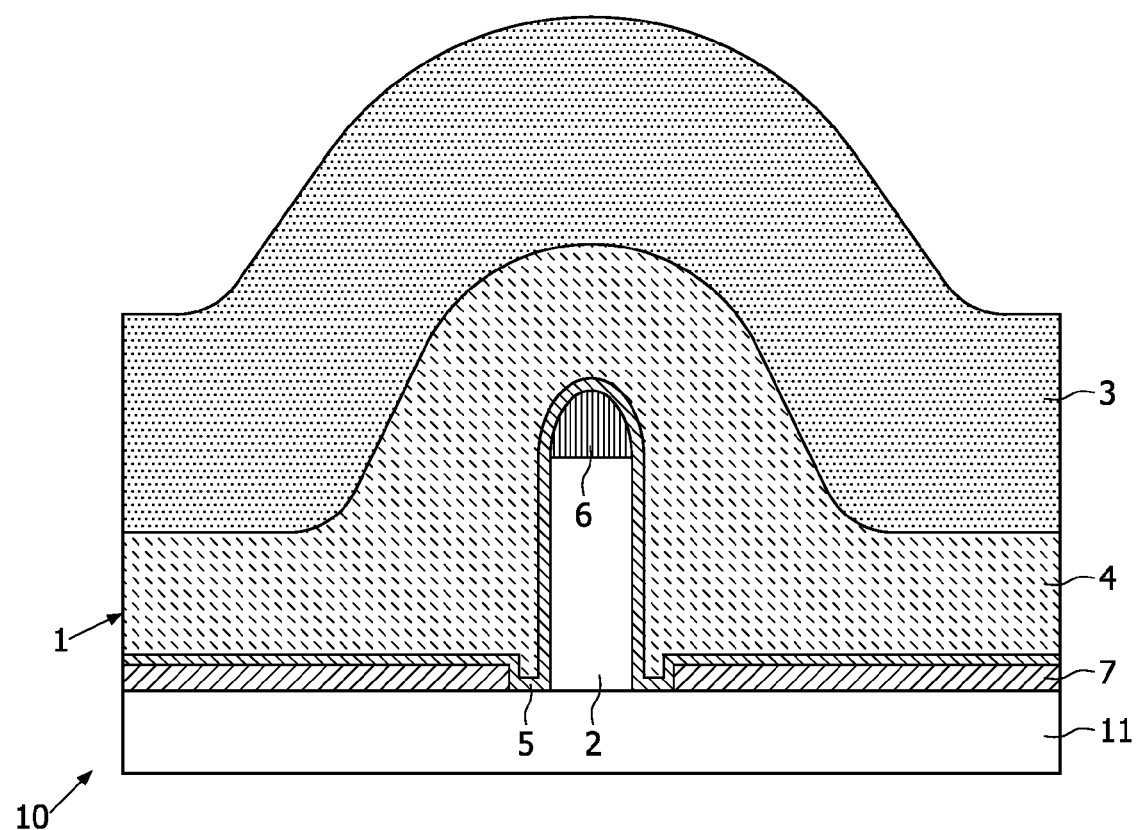

The Figures are not drawn true to scale and some dimensions have been exaggerated for reasons of clarity. Corresponding regions or components have been given the same hatchings and reference numerals as much as possible.

FIGS. 1 and 2 diagrammatically show a semiconductor device in consecutive stages of its manufacture by a known method (a) in a cross-section taken perpendicularly to the thickness direction and (b) in plan view. The device 10 (see FIG. 1) comprises, for example, a semiconductor body 1 of silicon with a silicon substrate 11. A nano wire 2 is formed thereon, and a layer 3 is deposited on top of that. It is apparent from part b of FIG. 1 that the wire 2 is not visible in plan view because the layer 3 is comparatively opaque. FIG. 2 shows the stage in which the nano wire 2 has been reached by a chemical-mechanical polishing process. Since it is not visible in advance when this stage will be reached, the process of exposing the nano wire 2 takes place comparatively inaccurately. Another possibility is that a major portion of the nano wire 2 has already been removed, whereby the function of the nano wire is affected.

FIGS. 3 to 5 diagrammatically show a first semiconductor device in consecutive stages of its manufacture by a first embodiment of a method according to the invention (a) in a cross-section taken perpendicularly to the thickness direction and (b) in plan view. The starting point (see FIG. 3) is an n-type substrate 11 of silicon. A number of components (not shown) of e.g. a bipolar transistor are formed therein, such as the collector region and the base region. (Hetero) epitaxy may be used for this purpose, and the semiconductor body may be provided with insulation regions that are recessed therein. The semiconductor body is then covered with an insulating layer (not shown) which is provided with openings in which a droplet of Au (not shown) is formed.

Subsequently a nano wire 2, made of Si here, is grown by means of a gas phase growing process. The droplet-shaped metal region is as it were lifted thereby, so that is will be present on top of the nano wire 2. The nano wire 2 forms, for example, the emitter of a bipolar transistor.

An electrically insulating layer 4 of silicon nitride is then deposited, and after that a layer 3 of, for example, silicon dioxide. Then a CMP process is started for planarizing the structure and exposing the nano wire 2. It is again apparent from the b-part of the Figure that the structure with the nano wire 2 is not visible, as was the case with the known method. The lateral dimensions of the latter structure have increased with respect to the nano wire by twice the thickness of the deposited silicon nitride layer.

The moment the nano wire covered by the silicon nitride layer 4 is reached in the CMP process (see FIG. 4), it will become clearly visible, as is shown in FIG. 4b. This stage may be readily detected by means of a pattern recognition technique.

After that (see FIG. 5) the nano wire 2 can be exposed in an accurate manner. This may be done, for example, in the same CMP process, of which advantageously the speed is reduced. An alternative CMP process of lower speed may also be used. A (selective) etching process may also be advantageously used for accurately exposing the nano wire 2. The manufacture of the device 10 can then be continued, for example in that a conductor is brought into contact with the exposed nano wire 2. Any remaining steps not yet carried out but necessary for having the device function properly may now be carried out. Individual devices can be obtained by means of a separation technique.

Figure 7:
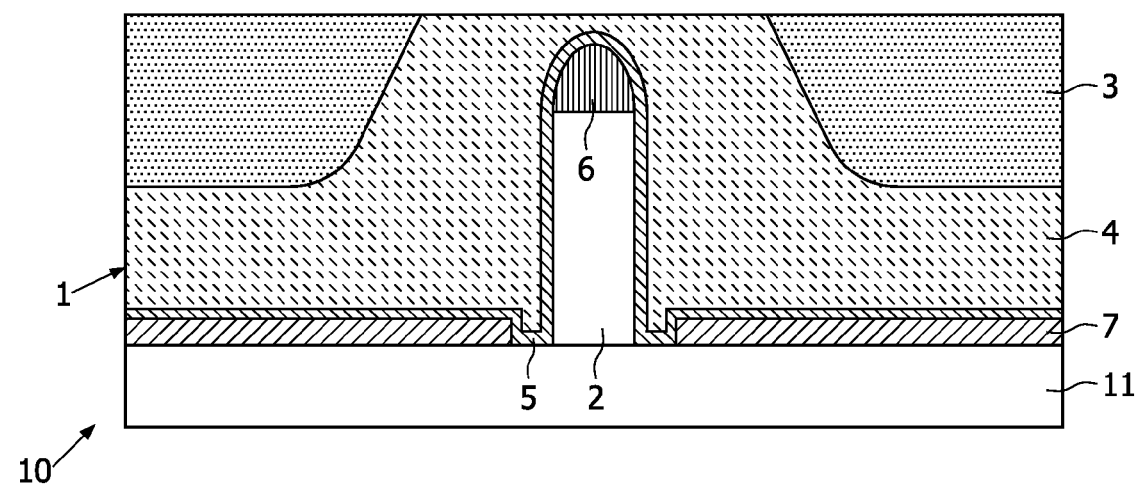
Figure 8:
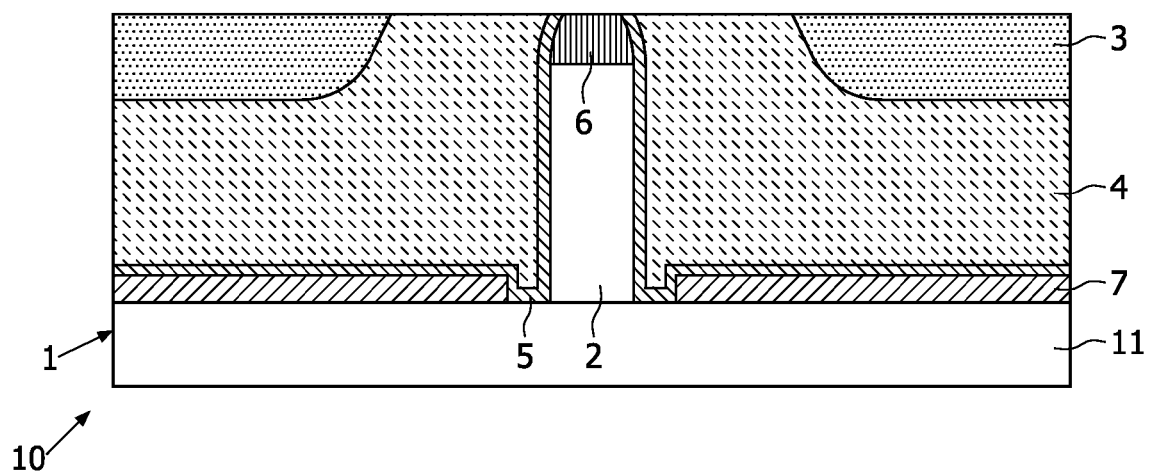

FIGS. 6 to 8 diagrammatically show a second semiconductor device in consecutive stages of its manufacture by a second embodiment of a method according to the invention in a cross-section taken perpendicularly to the thickness direction.

Initially the manufacture proceeds as discussed above for the first embodiment.

In the present case (see FIG. 6), an Au region 6 and an insulating layer 7 patterned on the semiconductor body 1 have also been depicted. After the formation of the nano wire 2 (with the Au region 6 present thereon), a thin layer 5, of silicon dioxide in this case, is provided thereon. Then a somewhat thicker layer 4 of a reflecting and electrically conducting material such as polycrystalline silicon, for example having half the height of the nano wire, which is 300 nm high in this example, is deposited over the structure. This layer 4 can perform an active function in a semiconductor element to be formed, of which the nano wire 2 forms part, for example the function of a gate electrode because of the small thickness of the insulating layer 5. As in the first embodiment, an electrically insulating layer 3 of silicon dioxide is provided up to the final desired thickness of the total layer stack.

Subsequently (see FIG. 7), the CMP process is started for planarizing the structure and exposing the nano wire. The moment at which the reflecting layer becomes exposed during this can be readily detected by means of a pattern recognition technique. This technique utilizes, for example, a lens system and an electronic camera connected to a microprocessor or a pc, which is provided with software for recognizing the pattern in the image formed by the camera. These components have not been depicted in the Figure for the sake of simplicity.

Subsequently (see FIG. 8), planarization is continued with the same or a different CMP process, possibly but not necessarily with a reduced removal rate. Alternatively, a (preferably selective) etching process may advantageously be used for this. The same holds for the removal of a portion of the electrically insulating layer 5 lying on the nano wire 2 and the Au region 6, if it is still present thereon. The manufacture can then be continued, for example, as indicated for the first embodiment above.

The invention is not limited to the embodiments discussed above, many variations and modifications being possible to those skilled in the art within the scope of the invention. Thus the invention may be used in the manufacture not only of a bipolar device, but also of a Bi(C)MOS (=Bipolar (Complementary) Metal Oxide Semiconductor) IC (=Integrated Circuit). The invention may be applied to discrete transistors as well as to ICs.

In a modification of the second embodiment, the material chosen for the further layer may be the same as the material from which the nano wire is formed.

It is finally noted that it is not necessary to use optical techniques for making the transition between the layer and the further layer distinguishable. Use may advantageously be made of techniques such as, for example, SEM (=Secondary Electron Microscopy) and AFM (=Atomic Force Microscopy). The difference in properties between said layers, therefore, need not necessarily be a difference in refractive index, but may also relate to other properties, such as the ease with which secondary electrons can be emitted or the force experienced by the atomic tip of a needle when it approaches the surface in which the transition is present.

The invention claimed is:

1. A method of manufacturing a semiconductor device with a substrate and a semiconductor body, the method comprising:

forming a semiconductor circuit in the semiconductor body by forming a mesa-shaped protrusion of the semiconductor body, which protrusion is provided in the form of a nano wire on the surface of the semiconductor body;

depositing a first layer of a material over the semiconductor body with the nano wire, the first layer having a thickness smaller than the height of the nano wire depositing a second layer of a material on the first layer and over the semiconductor body with the nano wire; and subsequently planarizing the resulting structure in a chemical-mechanical polishing process to expose an upper side of the nano wire is in response to a transition between the first and the second layer, seen in projection, being discernible before the nano wire is reached.

2. A method as claimed in claim 1, characterized in that the thickness of the first layer is at least 50 nm.

3. A method as claimed in claim 1, characterized in that the thickness of the first layer is at least 150 nm.

4. A method as claimed in claim 1, characterized in that the material of the second layer and the material of the first layer have different refractive indices.

5. A method as claimed in claim 1, characterized in that the material of the first layer is reflecting.

6. A method as claimed in claim 1, characterized in that the first layer includes polycrystalline silicon.

7. A method as claimed in claim 1, characterized in that the first layer includes a metal.

8. A method as claimed in claim 1, characterized in that the second layer includes silicon dioxide or silicon nitride.

9. A method as claimed in claim 1, further comprising forming a transistor with the nano wire.

10. A method as claimed in claim 1, characterized in that silicon is chosen to be the material of the semiconductor body.

11. A method as claimed in claim 1, wherein subsequently planarizing includes detecting the reaching of the further layer using a pattern recognition technique to identify the first layer.

12. A method as claimed in claim 1, further comprising depositing a third layer of a different material over the semiconductor body with the nano wire, the different material including an electrically insulating material is chosen for this different material.

13. A method as claimed in claim 12, further comprising, after at least one of the first layer and the third layer has been reached through chemical-mechanical polishing, removing a portion of this layer or these layers lying above the nano wire by selective etching.

14. A method of manufacturing a semiconductor device with a substrate and a semiconductor body, the method comprising:

forming a semiconductor circuit on the semiconductor body, the circuit including a mesa-shaped protrusion of the semiconductor body having a nano wire with a gold region;

patterning a first layer on the semiconductor body to form trenches adjacent the nano wire, the first layer including an insulating material;

providing a second layer over the first layer and the nano wire, the second layer contacting the semiconductor body in the trenches adjacent the nano wire;

depositing a third layer over the first layer, the nano wire, and the second layer, the third layer including a reflective material;

providing a fourth layer on the third layer, the fourth layer including insulating material;

planarizing the fourth layer by chemical mechanical polishing, at a first removal rate to remove a portion of the fourth layer and expose the third layer, the nano wire being discernable via the third layer; and in response to exposing the third layer and discerning the nano wire, planarizing the fourth layer, the third layer, and the second layer using a rate of removal that is less than that of the first removal rate to expose the nano wire.

15. The method of claim 14, wherein depositing the reflective layer includes deposing a reflective layer having a height half of the height of the nano wire.

16. The method of claim 14, wherein planarizing includes detecting the exposure of the reflective layer by a pattern recognition technique utilizing a lens system and an electronic camera.

* * * * *